(12) United States Patent
Kubota et al.

(10) Patent No.: US 9,835,661 B2
(45) Date of Patent: Dec. 5, 2017

(54) POWER CONTROL DEVICE AND POWER CONTROL METHOD

(75) Inventors: Eiichiro Kubota, Tokyo (JP); Antonio Avitabile, Basingstoke (GB); Costantino Cristiano Mariella, London (GB); Christopher Michael Rutherford, Brussels (BE); Edward Grellier Colby, Cambridge (GB); Nicholas George Bailey, Cambridge (GB); Alexander Charles Knill, Cambridge (GB); Harshul Deepak Mehta, Cambridge (GB)

(73) Assignee: SONY CORPORATION, Tokyo (JP)

( * ) Notice: Subject to any disclaimer, the term of this patent is extended or adjusted under 35 U.S.C. 154(b) by 324 days.

(21) Appl. No.: 13/806,530

(22) PCT Filed: Jun. 29, 2011

(86) PCT No.: PCT/JP2011/065408
§ 371 (c)(1),
(2), (4) Date: May 6, 2013

(87) PCT Pub. No.: WO2012/005272
PCT Pub. Date: Jan. 12, 2012

(65) Prior Publication Data
US 2013/0214763 A1    Aug. 22, 2013

(30) Foreign Application Priority Data
Jul. 9, 2010    (JP) .................................. 2010-156637

(51) Int. Cl.
*G01R 21/00*    (2006.01)
*H02J 3/14*    (2006.01)
(Continued)

(52) U.S. Cl.
CPC ........... *G01R 21/00* (2013.01); *G01R 22/063* (2013.01); *G01R 22/10* (2013.01); *G06Q 50/06* (2013.01);
(Continued)

(58) Field of Classification Search
CPC .......................... G01R 19/2513; G01R 19/003
(Continued)

(56) References Cited

U.S. PATENT DOCUMENTS 8,160,824 B2 *  4/2012  Spanier .............. G01R 19/2513
                                                 324/113
2006/0052958 A1 *  3/2006  Hancock .............. G01R 21/133
                                                 702/60
(Continued)

FOREIGN PATENT DOCUMENTS

CN    1427520 A    7/2003
JP    2009-130987    6/2009
(Continued)

OTHER PUBLICATIONS

Chinese Office Action issued in connection with related Chinese patent application No. CN 201180032849.1 dated Jul. 2, 2014.

*Primary Examiner* — Jermele M Hollington
*Assistant Examiner* — Christopher McAndrew
(74) *Attorney, Agent, or Firm* — Chip Law Group

(57) ABSTRACT

Information to be displayed on a display is generated in such a way that a gateway processes a measured value (with a time stamp) transmitted from a power meter, an appliance monitor, a solar module, and a battery center through a wireless LAN. In the gateway, information relating to the consumed electric energy is synchronized with each other by the time stamp. Further, an integrated value of the consumed electric energy is calculated with respect to time. The information can be secured by obtaining the integrated value (Continued)

of data even if breakdown of devices and the like occurs due to power failure.

9 Claims, 6 Drawing Sheets

(51) Int. Cl.
  *H02J 3/32* (2006.01)
  *H02J 3/38* (2006.01)
  *G01R 22/10* (2006.01)
  *G06Q 50/06* (2012.01)
  *G01R 22/06* (2006.01)
(52) U.S. Cl.
  CPC  *H02J 3/14* (2013.01); *H02J 3/32* (2013.01); *H02J 3/383* (2013.01); *Y02B 70/3225* (2013.01); *Y02E 10/563* (2013.01); *Y02E 10/566* (2013.01); *Y02E 70/30* (2013.01); *Y04S 20/222* (2013.01)
(58) Field of Classification Search
  USPC .............. 324/113; 346/150.2; 347/111
  See application file for complete search history.

(56) References Cited

U.S. PATENT DOCUMENTS

| | | | | |
|---|---|---|---|---|
| 2007/0059986 | A1* | 3/2007 | Rockwell | G01R 19/2513 439/638 |
| 2008/0140326 | A1* | 6/2008 | Scholtz | G01R 25/00 702/60 |
| 2008/0204272 | A1* | 8/2008 | Ehrke | G01D 4/002 340/870.02 |
| 2009/0012728 | A1* | 1/2009 | Spanier | G01R 19/2513 702/61 |
| 2009/0231152 | A1* | 9/2009 | Tung | G06F 1/206 340/660 |
| 2009/0265041 | A1* | 10/2009 | Benjamin | G05B 9/02 700/292 |
| 2009/0281679 | A1* | 11/2009 | Taft | G01D 4/004 700/297 |
| 2010/0007515 | A1 | 1/2010 | Ito | |
| 2010/0017045 | A1* | 1/2010 | Nesler | B60L 11/1824 700/296 |
| 2010/0076616 | A1* | 3/2010 | Kagan | G01R 19/2513 700/295 |
| 2010/0191487 | A1* | 7/2010 | Rada | G05F 1/70 702/60 |
| 2010/0217452 | A1* | 8/2010 | McCord | G06Q 50/06 700/295 |
| 2010/0217549 | A1* | 8/2010 | Galvin | H04B 3/54 702/62 |
| 2010/0259043 | A1* | 10/2010 | Balsamo | H02J 1/10 290/7 |
| 2010/0262312 | A1* | 10/2010 | Kubota | H01M 10/425 700/295 |
| 2013/0345999 | A1* | 12/2013 | Hafen | G01R 21/133 702/60 |

FOREIGN PATENT DOCUMENTS

| | | |
|---|---|---|
| JP | 2009-261159 | 11/2009 |
| JP | 2010-020536 | 1/2010 |
| WO | 20090066742 A1 | 5/2009 |

* cited by examiner

POWER CONTROL DEVICE AND POWER CONTROL METHOD

TECHNICAL FIELD

The present invention relates to a power control device and a power control method applied to control of storage and supply of a power storage device equipped in a home, for example.

BACKGROUND ART

In recent years, suppression of energy consumption has been required in factories, offices (buildings), and homes. According to statistical data of the energy consumption, the proportion of the energy consumption in homes is relatively high in total energy consumption. Therefore, the suppression of the energy consumption in homes is an issue to be addressed. A technology of controlling energy in homes is called a "home energy management system" (HEMS). The HEMS implements measures for energy conservation including on/off control of electrical appliances such as an air conditioner, collection of logs of power consumption, and the like.

For example, Patent Document 1 discloses that a measuring unit is provided corresponding to each branch breaker in a home, the period of use and used electric energy of each appliance are measured by the measuring units, and measured values are stored in a use history memory unit in association with an appliance number of each appliance.

CITATION LIST

Patent Document

Patent Document 1: Japanese Patent Application Laid-Open No. 2009-261159

SUMMARY OF THE INVENTION

Problems to be Solved by the Invention

In the invention disclosed in Patent Document 1, a management unit makes a use plan of electrical equipment according to a use history stored in the use history memory unit and improves energy conservation. As shown in the configuration disclosed in Patent Document 1, when information of electric energy is collected from multiple sites, it becomes difficult to obtain accurate information if information is missing due to communication difficulty and the like.

Therefore, a purpose of the present invention is to provide a power control device and a power control method capable of obtaining accurate information when information of used electric energy of each of a plurality of electrical equipment is collected.

Solution to Problems

The present disclosure provides a power control device, including:
a measuring device configured to measure a flow of power at a plurality of positions in a divided area and to generate a power measured value;
a transmission device configured to add a time stamp to the power measured value from the measuring device and to transmit the power measured value and the time stamp; and
a reception device configured to receive the power measured value and the time stamp from the transmission device,
wherein the reception device calculates an integrated value of the power measured value in a time direction.

The present disclosure provides a power control method, including the steps of:
measuring a flow of power at a plurality of positions in a divided area and generating a power measured value,
adding a time stamp to the power measured value and transmitting the power measured value and the time stamp;
receiving the power measured value and the time stamp; and
calculating an integrated value of the received power measured value in a time direction.

Effects of the Invention

According to at least one of embodiments, measurement can be performed while maintaining accuracy even if a measured value of power cannot be collected due to communication difficulty and the like.

MODE FOR CARRYING OUT THE INVENTION

Hereinafter, an embodiment of the present invention will be described. Note that the description will be given in the following order.

1. Embodiment

2. Modifications

Note that an embodiment to be described herein is a preferred specific example of the invention, and technically preferred various limitations are applied. However, the scope of the invention is not limited to the embodiment unless otherwise specifically described.

1. Embodiment

[An Example of a Power Control System]

Figure 1:
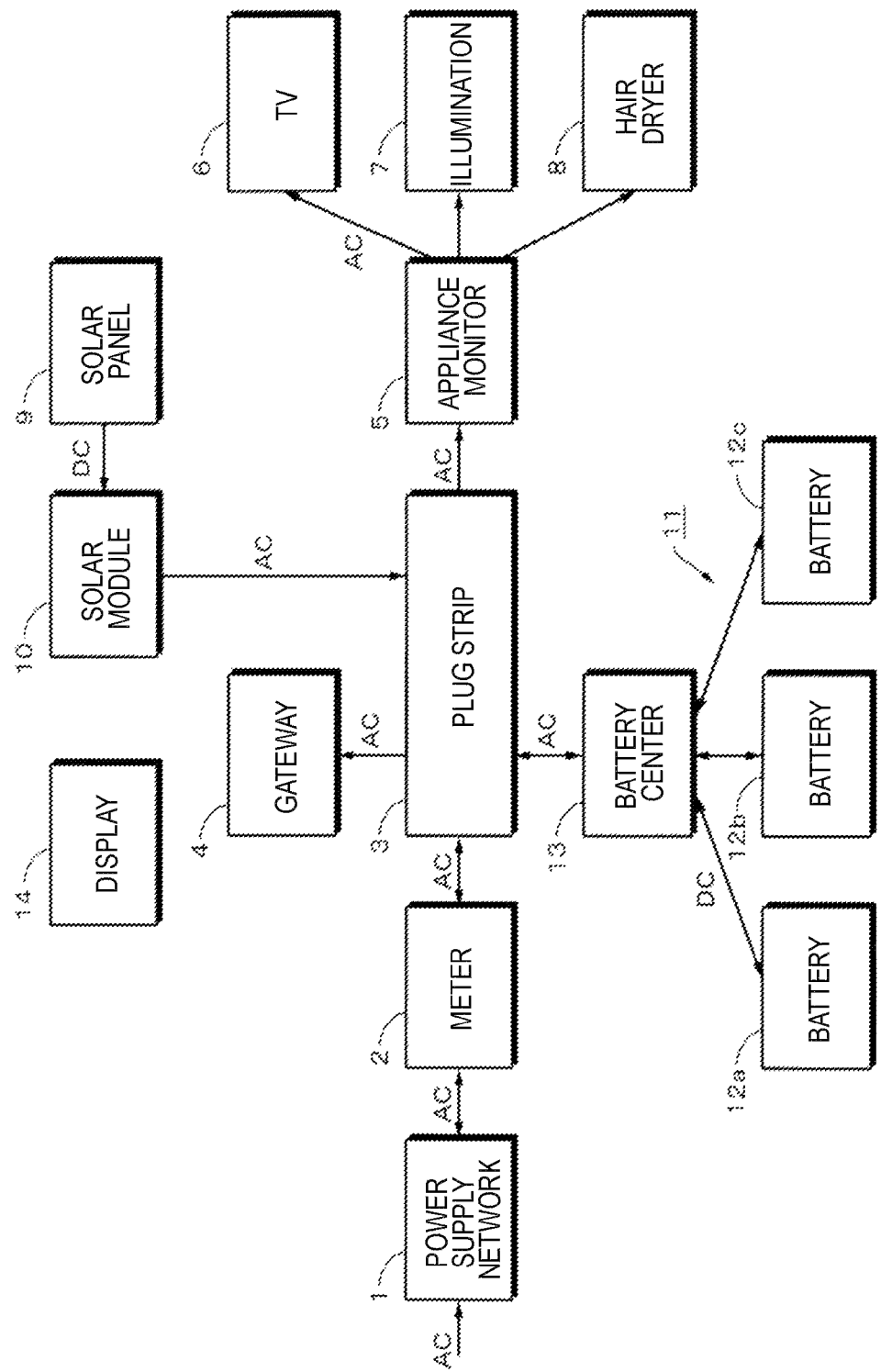
FIG. 1 is a block diagram showing a power system of an embodiment of a power control system according to the present invention.
Figure 2:
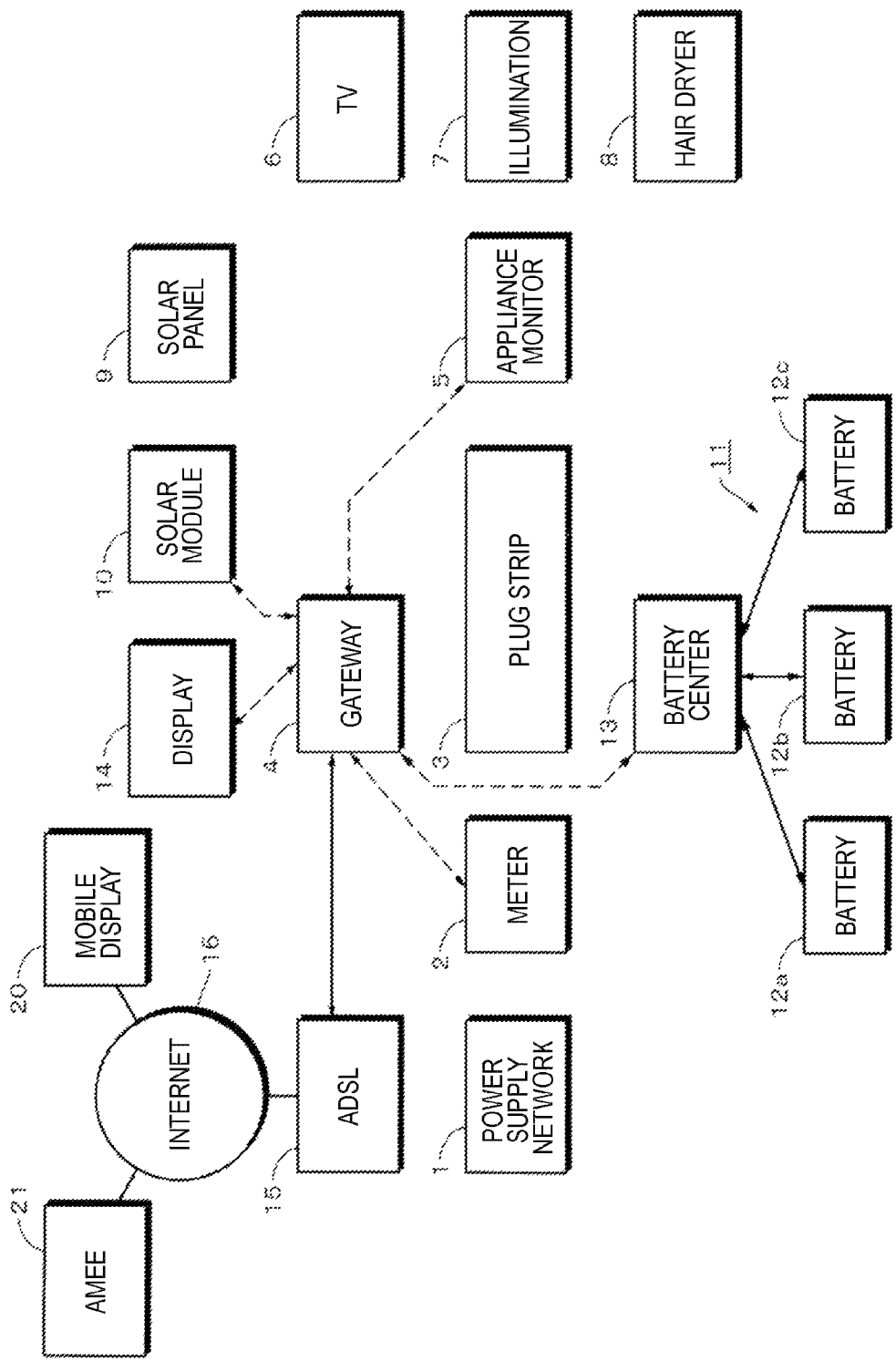
FIG. 2 is a block diagram showing a communication system of an embodiment of the power control system according to the present invention.

An example of a power control system in a divided area, for example, a power control system in a home will be described with reference to FIG. 1. FIG. 1 shows a supply channel of power and FIG. 2 shows a transmission path of information data, a control signal, and the like. Further, FIG.

3 is used for showing a concept of a home power network. Direct current (DC) and alternate current (AC) are shown as the type of power. For example, alternate current power of 220 V (60 Hz) flows in the home power network.

The power generated by a power plant is introduced through a power supply network 1 to the home via a power meter 2 in the home. The power plant includes a thermal power plant, a nuclear power plant, and the like. A CO2 emission amount of the power supplied to the home through the power supply network 1 differs depending on a power generation method. Further, a power rate of the power bought by a householder, the power being supplied from the power supply company, varies depending on the time of day. For example, the power rate at nighttime when a demand for power is small is set to be relatively reasonable compared with the power rate at daytime.

As shown in FIG. 2, a power meter 2 is connected to a gateway 4 in the home power network through a wireless local area network (LAN), for example. Devices connected through the wireless LAN are authenticated by mutual authentication. Further, to ensure security, data communicated through the wireless LAN is encrypted. The path in a solid line in FIG. 2 shows a communication path of a cable LAN and the path in a broken line shows a communication path of the wireless LAN.

The power meter 2 performs accurate measurement of the power supplied to the home through the power supply network 1 with a predetermined period, and transmits a measured value to the gateway 4 in the home power network by a communication unit through the wireless LAN. In this case, a measured time is transmitted as a time stamp along with the measured value. The time is time information common to the power network. For example, a reference time source is provided on the power network.

Commercial power supply introduced to the home through the power meter 2 is supplied to a plug strip 3. The plug strip 3 is an appliance having a plurality of power supply plugs in order to supply alternate current power. The alternate current power is supplied from the plug strip 3 to the gateway 4 and an appliance monitor 5. The alternate current power is supplied through the appliance monitor 5 to home electrical appliances including a television device 6, an illumination 7, and a hair dryer 8, for example. Note that these electrical appliances are examples, and in reality, more various types of electrical appliances are used in the home.

The appliance monitor 5 measures power consumption of each electrical appliance connected thereto with a predetermined period, for example, with a period of one second. Information of measured consumed power of each electrical appliance and a time stamp indicating a measured time are transmitted from the appliance monitor 5 to the gateway 4 via wireless communication.

Direct current power generated by a solar panel 9 configured from a solar cell is supplied to a solar module 10. Alternate current power synchronized with the alternate current power in the home is generated by the solar module 10. The generated alternate current power is supplied to the plug strip 3. In the plug strip 3, the alternate current power from the power meter 2 and the alternate current power from the solar module 10 are added and used as the power in the home. Not only the solar panel 9 but also a wind power generation device or the like that generates electricity by renewable energy may be used as a power generation device.

The solar module 10 is connected with the gateway 4 through the wireless LAN. The solar module 10 measures the direct current power generated by the solar panel 9 and the alternate current electric energy resulting from conversion of the direct current power and supplied to the power network. The measured value and the time stamp indicating the measured time are transmitted from the solar module 10 to the gateway 4 via the wireless communication.

As the power storage device in the home, a storage device 11 including three batteries 12a, 12b, and 12c is equipped, for example. The batteries 12a to 12c are, for example, lithium-ion batteries. The storage device 11 may employ an electrical double layer. A battery center 13 is provided in order to manage operations such as charging/discharging of the batteries 12a, 12b, and 12c in the storage device 11, and to convert the direct current power stored in the storage device 11 into the alternate current power. The storage device 11 and the battery center 13 are connected by a cable interface. For example, a serial peripheral interface (SPI) can be used. The alternate current power from the battery center 13 is supplied to the plug strip 3.

The battery center 13 is equipped with a plurality of sockets as physical connection units. The batteries 12a, 12b, and 12c are respectively inserted into/disconnected from the sockets. The batteries 12a, 12b, and 12c can employ different types. For example, a lithium-ion battery, a capacitor, a fuel cell, a micro cogenerator, and the like can be used. Each of the batteries can be uniquely identified by a secure battery identifier (battery ID). Even if the types of the batteries are different, all of the batteries can be inserted into the standardized sockets.

The socket secures physical connection and an interface between the batteries 12a, 12b, and 12c and the battery center 13. The battery center 13 manages the status of the batteries 12a, 12b, and 12c and monitors safety and reliability. The battery center 13 is connected with the gateway 4 through the wireless LAN. The gateway 4 receives information from the battery center 13 and transmits a control signal in relation to the batteries 12a to 12c to the battery center 13.

Figure 3:
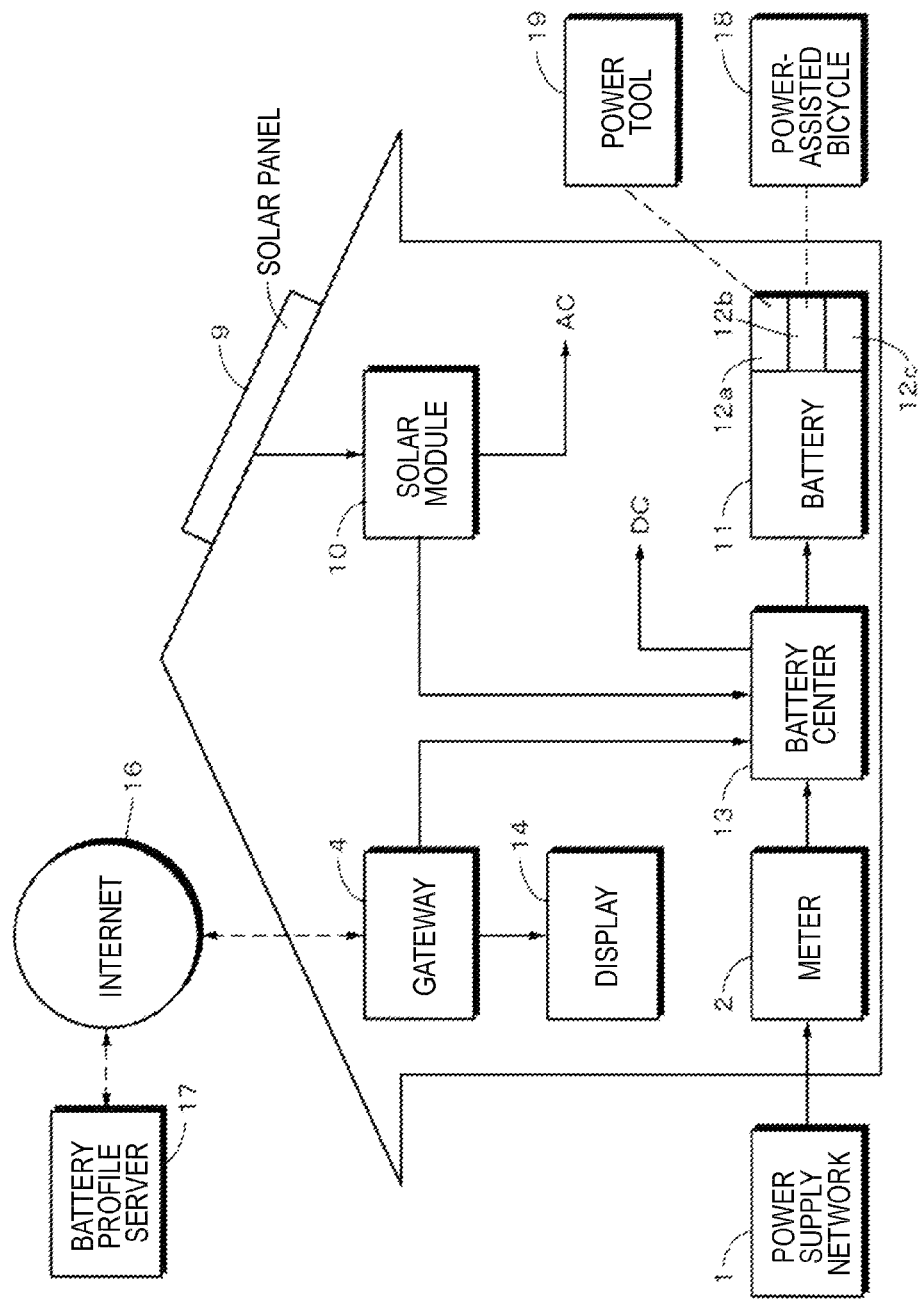
FIG. 3 is a block diagram used for conceptual description of the power system according to the embodiment of the present invention.

As shown in FIG. 3, the gateway 4 is connected with a battery profile server 17 on an internet 16 through an asymmetric digital subscriber line (ADSL) 15. The gateway 4 receives a battery ID and storage information corresponding thereto from the server 17, so that the batteries can be safely and properly charged. Further, information of use result of the batteries (the number of charging, trouble, and the like) is transmitted from the gateway 4 to the server 17, and storage information in a database in the server 17 is renewed into latest information.

As shown in FIG. 3, each of the batteries is configured to be detachable from the battery center 13 and is detached and used for other purpose of use. That is, the battery is used as a power source of an electric device, for example, a power-assisted bicycle 18 or a power tool 19. As described above, the battery can be used as power supply other than the household storage battery, and the control and the charging device are common to the several types of batteries, whereby the household storage battery can be configured at a low cost without deteriorating safety.

A display 14 is connected to the gateway 4 through the wireless LAN, and display information is transmitted from the gateway 4 to the display 14. The display 14 displays information or a part of the information exemplarily shown below to a user in the home.

The power supplied from the power supply network 1 to the home
The power supplied from the solar panel 9
Net power flowing into the battery center 13
The status of a battery on the battery center 13

The power consumed by an electrical appliance in the home

The proportions of green power and non-green power in used energy

The carbon emission strength of used power in real time

A carbon footprint of the power consumed by the home power network (For example, a value obtained by integrating emitted greenhouse effect gas (carbon emission strength) for one month is displayed as the carbon footprint, so that the carbon emission amount is visualized.)

The above-described information to be displayed on the display 14 may also be displayed on a mobile display 20 on the internet 16. Examples of the mobile display 20 include a mobile phone and a mobile personal computer. Further, a control signal for controlling the power network can be transmitted to the gateway 4 in the home using these mobile terminals.

[A Time Stamp Associated with Measured Data]

The above-described information to be displayed on the display 14 is generated such that a measured value (with a time stamp) transmitted from the power meter 2, the appliance monitor 5, the solar module 10, and the battery center 13 through the wireless LAN is processed by the gateway 4. In the gateway 4, used electric energy is synchronized with each other by the time stamp. Further, an integrated value of the used electric energy in a time direction is calculated. As a power measuring instrument, an instrument that satisfies a predetermined specification is used in order to secure accuracy. Further, accurate measurement in relation to the power serves as a base of a function to inform a householder of numerical value data that is obtained by adjusting/converting energy consumed in the home into a carbon dioxide emission amount with accuracy.

A typical example of monitoring the status of use of the energy in the home is to integrate and display, on a display, a total energy amount consumed during a specific period (time). As described above, the measured value is data associated with a time stamp that indicates a measured time. Therefore, assuming that two measured values are obtained, instant power P can be obtained by dividing a difference between the two measured values $E_1$ and $E_2$ of the energy by a difference between the times $T_1$ and $T_2$.

$$P=(E_2-E_1)/(T_2-T_1)$$

Information can be secured by obtaining the integrated value of data even if breakdown of devices and the like due to power failure occurs. In a system that treats data as power, even if only one data is missing, the integration that includes a period in which the measurement could not be carried out becomes a speculation. Therefore, the conversion/adjustment of the total energy amount becomes inaccurate. If it is a system based on information in association with a time stamp that indicates a measured time, recovery of the breakdown and accuracy of the conversion can be realized.

[Control of a Power Control System from an Outdoor]

Further, remote control of the storage device 11 from an outdoor with a mobile terminal on a network through the internet 16 and the gateway 4 is possible. A simple example of an application fully using this merit is that the householder operates the power storage device from the outdoor to flexibly change an operation of the system in accordance with the action of the householder. In a case where larger power consumption than usual is expected when the householder goes out and next comes back home, the householder can give an instruction of storing energy in advance to the storage device 11 from the outdoor. Further, for example, when the householder leaves a house on vacation and the like, it is possible to make a long-term contract to entrust control of the storage of the power to the public utility company (power company).

[Control of a Storage Device Based on the Carbon Emission Strength of Energy to be Used]

When obtaining the carbon emission strength, it may be possible to access a server on the internet 16, more specifically, an application program interface (API), to transmit information of consumed power and the like in the home to the API, and to calculate the carbon emission strength in the API. An example of the API includes an avoiding mass extinctions engine (AMEE) 21. The AMEE 21 collects energy data all around the world and stores various forms of energy consumption data collected for long periods. According to a profile defined by the AMEE 21, the gateway 4 can obtain information in relation to the CO2 emission amount of the home where the gateway 4 is located.

The gateway 4 can control when to store the energy in the storage device 11 as the power and when to supply the energy from the storage device 11 based on the carbon emission strength calculated on its own or by the API. Further, the gateway 4 can control allocation of the storage and the supply.

An example of a rule of the control based on the carbon emission strength will be described. This rule is an algorithm for minimizing the total carbon emission strength by the power consumption. The above-described power control system is set to store the power in the storage device 11 only when the carbon emission strength of supplied energy is lower than a certain threshold value. When the carbon emission strength is high, the power is supplied from the storage device 11. Such a power control system enables the householder to consume the energy with a lower carbon emission amount.

In the power control system, the carbon emission strength of energy to be used can be obtained as net carbon emission strength based on the energy generated by a power generator (solar panel 9) disposed in the home in addition to the energy supplied from outside (power company). The carbon emission strength varies depending on how the energy has been generated. The energy stored in the storage device 11 with lower carbon emission strength is more favorable. Information in relation to the carbon emission strength of the energy supplied from the power company can be obtained not only from the power company but also from the above-described AMEE.

There are two costs for storing the power in the power control system. The first cost is a cost of the power to be stored itself. The second cost is a cost caused by durable years (deterioration) of a battery used for storing the power. When determining the rule about when to charge and what rate to charge, both aspects of the costs: the power and an exchange of the battery should be considered. According to the power control system, by quickly storing the energy when the carbon emission strength is low, an unnecessary cost caused by the deterioration of the battery due to the quick charging can be canceled out.

[Control of a Storage Device Based on a Buying Power Rate]

When the storage device 11 is controlled, a buying power rate of energy is considered. The buying power rate of energy (power) varies depending on the time of day, the season, and the like. The power control system calculates the storage of power in the home and the buying power rate of energy presented by the power company. The buying power rate changes due to adjustment of the demand and supply balance of power by the power company and a spot price in the power market.

Information of the buying power rate can be obtained by a consumer from the power company. The power control system defines the rule of when to store the energy as the power and when to supply the energy. Further, the allocation of the storage and the supply can be controlled. The power control system is set to store the power only when the buying power rate by the consumer to whom the energy is supplied is lower than a certain threshold value. Such a power control system is effective in enabling the householder to minimize the cost of the energy consumed in the home.

The rule of determining when to store the energy as the power and what rate to charge is determined considering both of the cost of the storage, that is, the cost of the power itself, and the life of the battery. According to the power control system, when the buying power rate by the consumer is low, an unnecessary cost caused by the deterioration of the battery due to quick charging can be canceled out by rapidly storing the energy.

[An Example of a Display on a Display]

Figure 4:
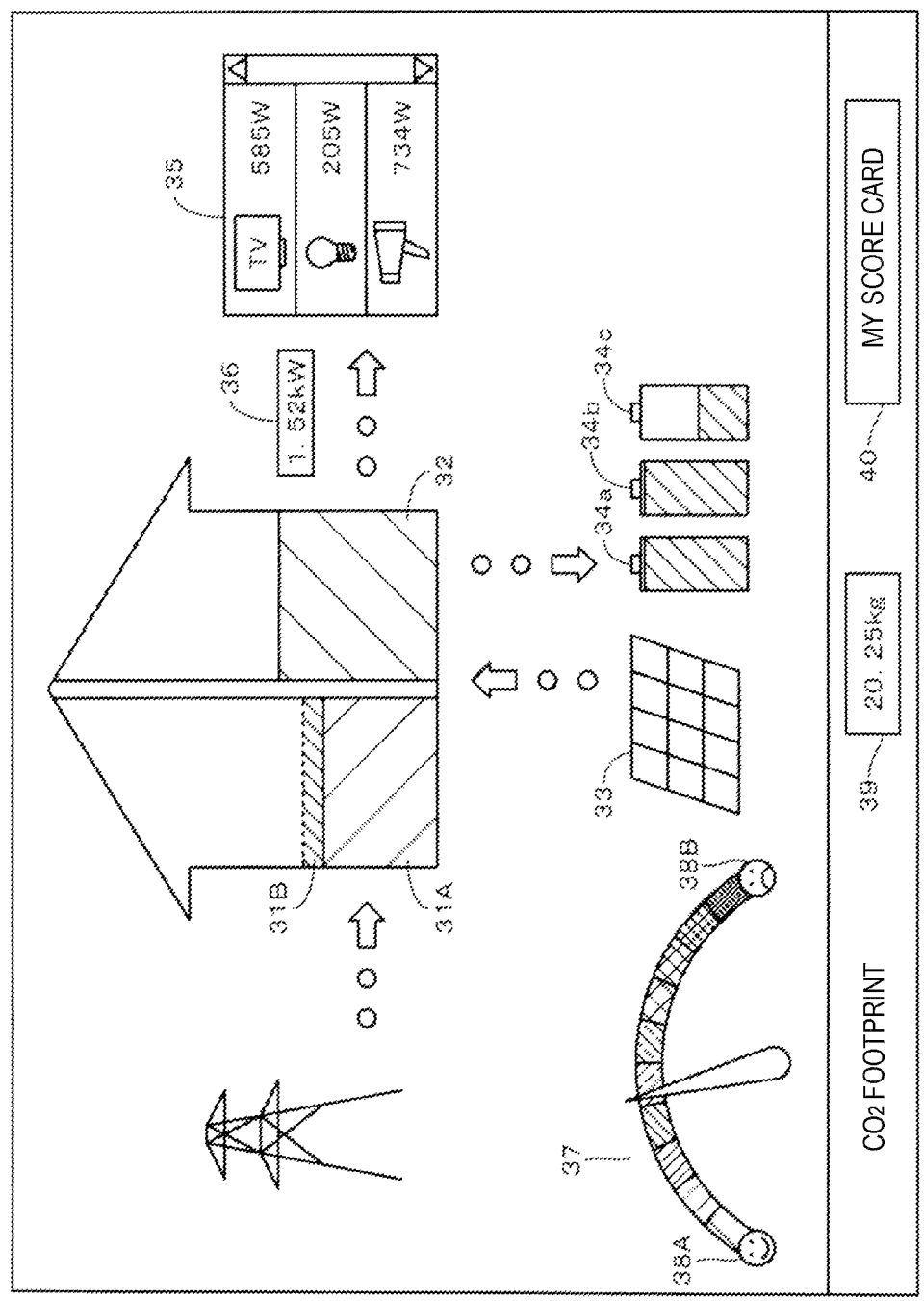
FIG. 4 is an outline diagram showing a display on a display according to the embodiment of the present invention.

An example of a display on the display 14 will be described with reference to FIG. 4. The display on the display 14 is a color display. A mark of a house is displayed in a nearly center of a display area. The mark of the house is divided into two, and a display 31A indicating an amount of the power supplied from the power supply network 1 to the home is displayed on the left half of the mark facing the drawing. Usually, this power is the non-green power (power with relatively high carbon emission strength) and is therefore indicated in red. However, when the green power (power with relatively low carbon emission strength) exists in the power supplied from the power supply network 1, a display 31B (green) corresponding to an amount of the green electric energy is displayed as shown in the broken line. These displays 31A, 31B, and 32 are animation displays changing in real time.

The display 32 corresponding to an amount of the green power generated by the solar panel 9 (shown by an icon 33 in FIG. 4) is displayed on the right half of the mark facing the drawing. Further, icons 34a, 34b, and 34c corresponding to the three batteries that constitute the storage device 11 and indicating respective stored amounts are displayed. Further, an area 35 that indicates electrical appliances in the home is provided, and respective icons of working electrical appliances in the area 35 and current consumed power are displayed. A display 36 indicating current total consumed electric energy is displayed.

Further, an indicator 37 is displayed. The position pointed by a pointer mark of the indicator 37 shows the degree of greenness (cleanness) of the electric energy currently supplied to the home. A left hand icon 38a on the indicator 37 shows the most favorable position and a right hand icon 38b shows the worst position. Therefore, the more left the pointer mark points at, the more favorable the degree of greenness is, whereas the more right the pointer mark points at, the worse the degree of greenness is.

Further, a display 39 of a carbon footprint is displayed on a lower part of the display area. The carbon footprint is a value resulting from conversion of the total power consumed in the home during a predetermined period such as one month into the CO2 emission amount. As described above, when obtaining the CO2 emission amount, the carbon footprint is obtained considering the carbon emission strength of each power in accordance with a generation method.

A display 40 of my score card is displayed on a lowermost part of the display area. A score displayed on the display 40 of my score card is a meaningful value for the user's (householder's) interests. For example, the score is a base of an environmental subsidy supplied by the government. Alternatively, it serves as a transaction object in a transaction market of a CO2 emission amount.

[Regarding a Scale of the Degree of Greenness (Greenness Gauge)]

As described above, the total carbon emission strength of the power consumed in the home is displayed on the display 14. The total carbon emission strength is shown in a form of a scale (gauge). The calculation of a variable for obtaining this scale can consider the energy generated by a solar cell disposed in each home, or by a combined heat and power (CHP) facility and the like, as well as the energy supplied from outside (power company). For example, the scale is calculated with the following formula. "E" represents an energy amount and "C" represents a carbon cost.

$$G=\Sigma E(\text{supply}),E(\text{solar}),E(\text{CHP}),E(\text{battery})/\Sigma C(\text{supply}),C(\text{CHP}),C(\text{battery})$$

In this calculation, it is assumed that a "carbon cost" to the power obtained by the solar cell is zero or is a "carbon cost" caused in the implementation. The "carbon cost" of the power supplied from a battery may be a "carbon cost" of the power for charging, or may be integration of a specific "carbon cost" in each use of the battery and/or a proportion of the specific "carbon cost" in each use of the battery to a total cost.

Further, this scale (gauge) may include information of total consumed power. In this way, this scale (gauge) can serve as an indicator showing whether the home uses carbons in an efficient manner. Another formula of calculating the scale is shown below.

$$G=\Sigma E(\text{supply}),E(\text{solar}),E(\text{CHP}),E(\text{battery})/\Sigma E(\text{supply}),E(\text{solar}),E(\text{CHP}),E(\text{battery})+\Sigma C(\text{supply}),C(\text{CHP}),C(\text{battery})$$

With the display on the above-described display 14, in the home, the householder can immediately get to know a balance between the energy supplied from outside (power company) and the energy generated in each home.

[Power Conditioner]

Figure 5:
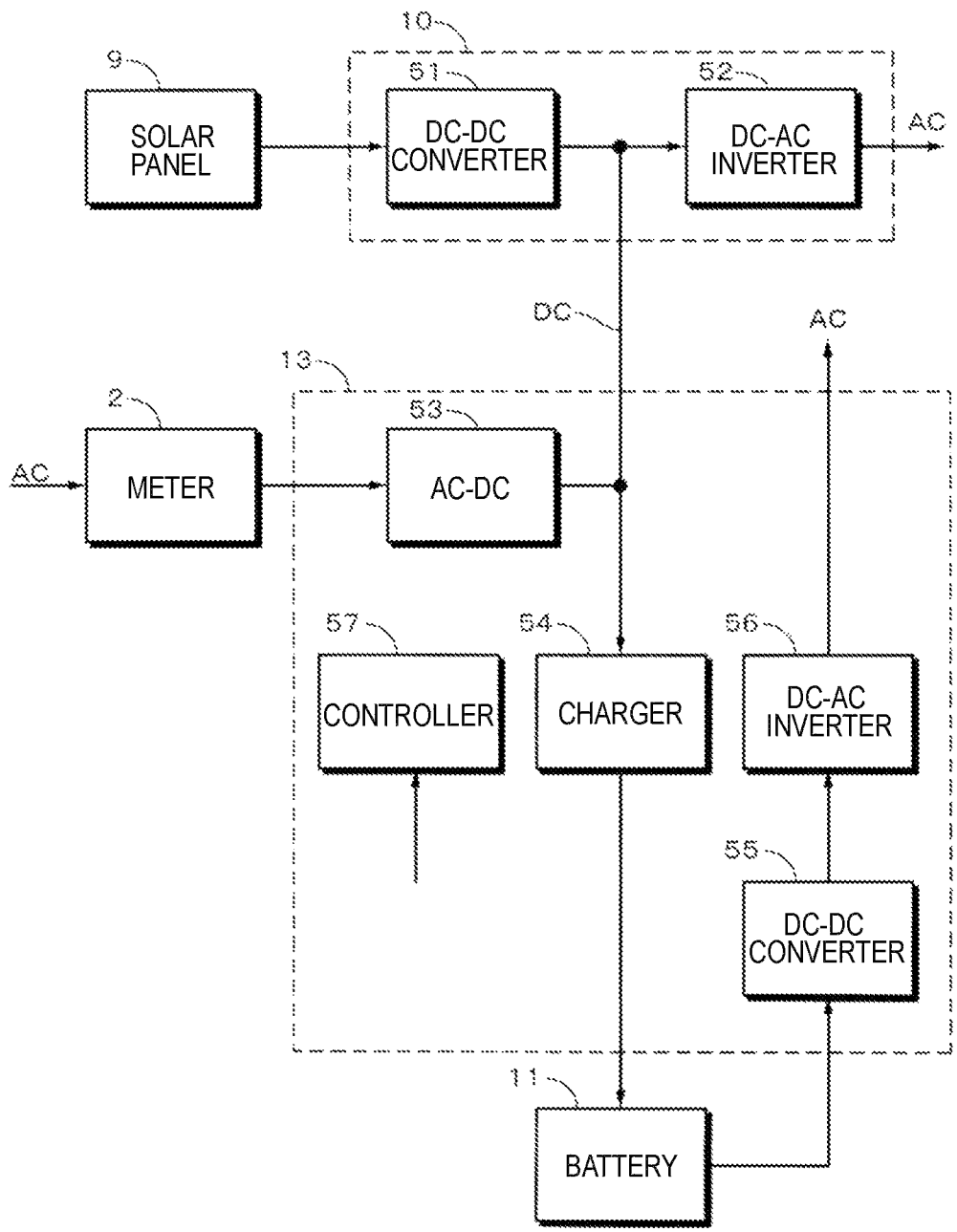
FIG. 5 is a block diagram used for description of a power conditioner connected to a solar panel and a storage device.

A first power conditioner and a second power conditioner provided in each of the solar module 10 and the battery center 13 will be described with reference to FIG. 5. FIG. 5 shows a partial configuration of the battery center 13.

A direct current voltage generated in the solar panel 9 is supplied to a DC-DC converter 51 and is output as a predetermined direct current voltage. The output voltage from the DC-DC converter 51 is supplied to a DC-AC inverter 52. The DC-AC inverter 52 is, for example, configured to be a grid tie inverter (GTI) and outputs alternate current power in synchronization with alternate current power of the power supply network at an output side.

Power generation by the solar panel 9 varies depending on the weather, the time of day, and the like. Therefore, when an output voltage of the solar panel 9 is supplied to the DC-AC inverter 52, the DC-DC converter 51 is used in order to stabilize an input voltage of the DC-AC inverter 52. Further, the DC-DC converter 51 is configured to adjust the impedance of an output in accordance with the impedance of the solar panel under any input light at any given time. This characteristic of following a maximum value of a load on the solar panel 9 is known as "maximum peak point tracking"

(MPPT, a maximum power point tracking control function that follows a point at which output power of the solar panel is maximized).

Further, the DC-DC converter 51 and the DC-AC inverter 52 configured to be a GTI require an assumption that an AC line obtains the power from other power supply before the transmission of power. The reason is to ensure the safety of an engineer who works in the wiring network. Because of such a characteristic, a certain amount of delay occurs during a period from a DC input timing to an AC output timing in the DC-AC inverter 52.

Alternate current power from the power meter 2 is converted into direct current power by a rectifier circuit 53 of the battery center 13. The direct current power from the DC-DC converter 51 of the solar module 10 and/or the direct current power from the rectifier circuit 53 of the battery center 13 are supplied to a charger 54. A battery of the storage device 11 is charged by the charger 54.

The storage device 11 is similar to a solar panel in generation of the direct current power, and a power conditioner is also connected to an output of the storage device 11. That is, the direct current power generated by the storage device 11 is supplied to a DC-DC converter 55. Predetermined direct current power from the DC-DC converter 55 is supplied to a DC-AC inverter 56. Alternate current power output from the DC-AC inverter 56 is supplied to a home alternate current power system. The DC-AC inverter 56 is configured to be a GTI.

As described above, when each battery is configured to be detachable from the battery center 13, authentication is performed between the battery center 13 and the battery before the charging and discharging of the battery is performed, and only when the authentication is established, the charging and discharging are processed. In the authentication process, an ID of each battery is used.

For such an authentication process and charging and discharging operations, a controller 57 and a wireless communication unit (not shown) are provided in the battery center 13 in order to control each part of the battery center 13. The controller 57 is configured from a microcomputer. The above-described DC-DC converter 55 and the DC-AC inverter 56 constitute a first power conditioner and the DC-DC converter 51 and the DC-AC inverter 52 of the solar module 10 constitute a second power conditioner. As each circuit block that constitutes these power conditioners, an identical configuration is used for the reason of consistency of control, ease of access, and the like.

Figure 6:
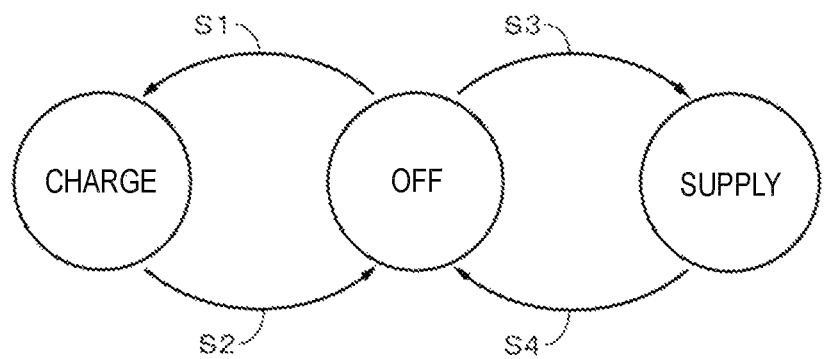
FIG. 6 is a status transition diagram used for description of a process of controlling charging/discharging of the storage device.

An example of control of a charging/discharging process by the controller 57 will be described with reference to FIG. 6. In FIG. 6, three types of the status: "charging", "off", and "supply (allocation)" are shown.

A condition of a transition S1 from "off" to "charging" (A solar panel output ≥150 W) and (the charging status <90%)

A condition of a transition S2 from "charging" to "off" (A solar panel output <150 W) or (the charging status ≥90%)

A condition of a transition S3 from "off" to "supply" (An electrical appliance load ≥50 W) and (the charging status ≥25%), or (a solar panel output ≥150 W) and (the charging status <90%)

A condition of a transition S4 from "supply" to "off" (An electrical appliance load <50 W) or (the charging status <25%)

The above-described control of a charging/discharging process is an example of a control of charging the storage device 11 only by an output from the solar panel. Other control method may be available when the storage device 11 is chargeable with an output from the above-described rectifier circuit 53. Further, the numerical values of the threshold values for determination are mere examples and various values can be set.

As described above, the DC-DC converter 51 and the DC-AC inverter 52 have a certain amount of delay during the period of the DC input timing to the AC output timing in the DC-AC inverter 52. However, the output voltage from the storage device 11 is desired to instantly supply the power as demanded.

To satisfy such a demand, the DC-DC converter 55 is configured to have two output voltages. The first output voltage is a stand-by voltage. The stand-by voltage is lower than the threshold value when the DC-AC inverter 56 begins to supply the power to outside, and is a sufficient voltage for the DC-AC inverter 56 to operate. The second voltage is a voltage with which the DC-AC inverter 56 begins to supply the power to outside. In this way, the DC-DC converter 56 outputs the first voltage at which the DC-AC inverter 56 stands by in order to instantly transfer to a supply mode.

The DC-DC converter 51 includes, as described above, the maximum power point tracking control function. Similarly, the DC-DC converter 55 into which the output voltage from the storage device 11 is input includes the maximum power point tracking control function. The storage device 11 has an output characteristic that is different from the solar panel. Therefore, when the DC-DC converter 55 connected to the storage device 11 includes the maximum power point tracking control function, the storage device 11 causes a system (power supply to the AC line) to be unstable. Therefore, the DC-DC converter 55 is configured to dynamically change the output impedance in such a way that the output impedance traces a load curve of the solar panel.

Note that, in a system in which one DC-AC inverter (GTI) is included for a plurality of batteries and a plurality of DC-DC converters, this load curve simulation means that a plurality of outputs of a plurality of DC-DC converters is merely connected in parallel.

2. Modification

As described above, an embodiment of the present invention has been specifically described. However, the present invention is not limited to the above-described embodiment, and various modifications based on technical ideas of the present invention are possible. For example, a power controller system can be applied to a divided area besides a home.

REFERENCE SIGNS LIST

1 Power supply network
2 Power meter
4 Gateway
5 Appliance monitor
9 Solar panel
10 Solar module
11 Storage device
13 Battery center
14 Display
51 and 55 DC-DC converter
52 and 56 DC-AC inverter

The invention claimed is:
1. A power control device, comprising:
a controller configured to:
receive communications from a power measuring device, the power measuring device configured to measure a flow of power at a plurality of positions over a network, wherein the communications include at least a power measurement value associated with time data;

calculate a carbon emission footprint from the communications received from the power measuring device based on an integration of the power measurement value associated with the time data measured at each of the plurality of positions; and communicate with a battery controller over the network to control, based on the carbon emission footprint, at least one battery.

2. The power control device of claim 1, wherein the controller is further configured to:

receive communications from an appliance monitor over the network, wherein the communications include an amount of power consumed by at least one electrical appliance and associated time data;

receive communications from a power generation system, wherein the communications include a power generation value and associated time data; and communicate with the battery controller to control the at least one battery based on at least the communications received from the appliance monitor, wherein the carbon emission footprint used by the controller is also based on the communications received from the power generation system.

3. The power control device of claim 2, wherein the communications received from the appliance monitor are utilized to calculate at least one of a total amount of power consumed by the at least one electrical appliance, a total of generated power indicated by the power generation value, or a difference between the total of the consumed power and the total of the generated power.

4. The power control device of claim 1, wherein the controller is further configured to transmit information over the network to a computing device and receive the carbon emission footprint from the computing device based on the transmitted information.

5. The power control device of claim 1, wherein the controller is further configured to communicate with the battery controller to control timings to store energy in the at least one battery and to supply the energy from the at least one battery.

6. The power control device of claim 1, wherein the controller is further configured to communicate with the battery controller to store energy in the at least one battery based on a determination that the carbon emission footprint is less than a threshold value.

7. The power control device of claim 1, wherein the controller is further configured to communicate with the battery controller to supply energy from the at least one battery based on a determination that the carbon emission footprint is not less than a threshold value.

8. The power control device of claim 2, wherein the communications received by the controller from the power generation system relate to power generated by at least one solar panel.

9. The power control device of claim 1, wherein the communications received by the controller from the power measuring device relate to power supplied by a power supply company.

* * * * *